United States Patent [19]
Landis

[11] Patent Number: 4,647,882
[45] Date of Patent: Mar. 3, 1987

[54] MINIATURE MICROWAVE GUIDE
[75] Inventor: Richard C. Landis, Shelton, Conn.
[73] Assignee: ITT Corporation, New York, N.Y.
[21] Appl. No.: 671,273
[22] Filed: Nov. 14, 1984
[51] Int. Cl.$^4$ .............................................. H01P 3/18
[52] U.S. Cl. .................... 333/239; 333/248; 29/600
[58] Field of Search .................... 333/239, 26, 248; 29/600

[56] References Cited

U.S. PATENT DOCUMENTS

| | | | |
|---|---|---|---|
| 2,995,806 | 8/1961 | Allison et al. | 333/239 X |
| 3,150,336 | 9/1967 | Gonda | 333/243 X |
| 3,157,847 | 11/1964 | Williams | 29/600 X |
| 3,199,054 | 8/1965 | Holland et al. | 333/163 |
| 3,292,115 | 12/1966 | La Rosa | 333/239 |
| 3,376,463 | 4/1968 | Feinstein | 315/3.5 |
| 3,436,690 | 4/1969 | Golant et al. | 333/156 |
| 3,484,725 | 12/1969 | Sobotka | 333/161 |
| 3,504,223 | 3/1970 | Orr et al. | 315/3.5 |
| 3,555,461 | 1/1971 | Ralph et al. | 333/156 |
| 3,622,884 | 11/1971 | Kent | 361/414 X |
| 3,649,274 | 3/1972 | Older et al. | 430/312 |
| 3,666,983 | 5/1972 | Krah et al. | 333/162 X |
| 3,900,806 | 8/1975 | Caroli | 333/156 X |
| 3,922,479 | 11/1975 | Older et al. | 361/414 X |
| 3,924,204 | 12/1975 | Fache et al. | 333/21 R |
| 4,159,222 | 6/1979 | Lebow et al. | 156/632 |
| 4,306,925 | 12/1981 | Lebow et al. | 156/150 |
| 4,439,748 | 3/1984 | Dragone | 333/239 |
| 4,465,984 | 8/1984 | McDowell | 333/161 X |

FOREIGN PATENT DOCUMENTS

| | | | |
|---|---|---|---|
| 0009348 | 1/1977 | Japan | 333/33 |
| 0085902 | 7/1981 | Japan | 333/239 |

OTHER PUBLICATIONS

Chalman, Ronald C. et al., "Multiple Functions of Blind Copper Vias in Polymide Multilauer Structures"; 4th Ann. Int'l Electronics Packaging Conf.; 29–31 Oct. 1984, Balt. Md.
Collenberger et al., "Method for Fabricating Precision Waveguide Sections"; NBS Technical Note 536; pp. 10–13, Jun. 1970.
Rogan, Gruyle L.; Microwave Transmission Circuits; McGraw Hill Book Company N.Y., N.Y. 1948; pp. 344, 347–348.

Primary Examiner—Eugene R. Laroche
Assistant Examiner—Benny T. Lee
Attorney, Agent, or Firm—Peter C. Van Der Sluys; Robert A. Hays

[57] ABSTRACT

A miniature microwave guide is provided in a substrate made of successive superimposed layers of conductive and/or dielectric materials. Probes are provided at the extreme ends of the guide for injecting and extracting signals.

20 Claims, 11 Drawing Figures

MINIATURE MICROWAVE GUIDE

BACKGROUND OF THE INVENTION

This invention pertains to a miniature microwave guide for printed circuit boards and more particularly to a guide imbedded in a board and a method of making the same.

Customarily, microwaves are transmitted between two devices by using metallic waveguides. The cross-sectional dimensions of the waveguides depend on the frequency of the waves and the desired transmission modes. However the waveguides required to transmit ultra high frequency signals (such as signals in the gigahertz range) have very small wavelength (in the order of mils.) so that it is impossible to make these waveguides by standard manufacturing techniques.

OBJECTIVES AND SUMMARY OF THE INVENTION

It is a principle objective of the present invention to provide a miniature microwave guide capable of handling signals in the gigahertz range.

Another objective is to provide a method of making the above-mentioned waveguide.

A further objective is to provide a printed circuit board having a microwave guide imbedded therein.

The waveguide in accordance with this invention, is formed from a plurality of successive strips of a conductive material constructed and arranged to generate a preselected profile. Preferably a printed circuit board substrate is formed by overlapping layers containing said strips and a dielectric material. Appropriate probes are provided at the extreme ends of the guide for passing signals into and out of the waveguide. The probes have a cross-sectional shape which corresponds to a pre-selected mode of transmission of said signals through the guide.

DETAILED DESCRIPTION OF THE INVENTION

In copending application, Ser. No. 671,276, filed on even date herewith, entitled "MICRO-COAXIAL SUBSTRATE" and incorporated herein by reference, a printed circuit board is disclosed which has a fully shielded conductor imbedded therein for interconnecting various electronic devices mounted on said board. The board comprises a substrate which is formed by overlapping a plurality of layers of dielectric and/or conducting materials to form a conductor surrounded by a shield. The method described in the above-mentioned patent application may also be used to generate a miniature waveguide in a printed circuit board substrate.

Figure 1:
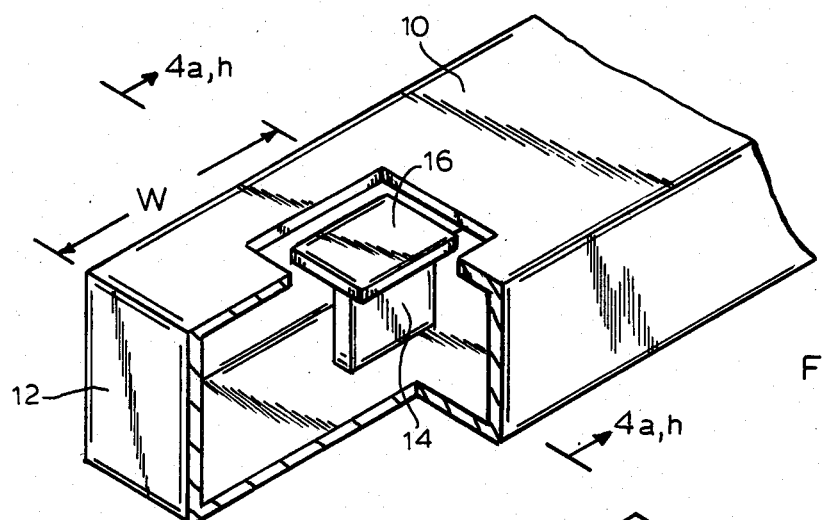
FIG. 1 is an isometric partial sectional view of the preferred embodiment of the invention.

For example, as shown in FIG. 1, a rectangular microwave comprises a tubular member 10 made of a conductive material and having an end wall 12. A probe 14 is provided to inject the microwave signals into the waveguide. Preferably the probe is attached to an input pad 16 which is coplanar with one of the guide walls as shown for connection to a microwave signal source (not shown). At the other end of the guide 10 a similar probe and output pad is used to extract the signal from the guide. The probe shown in FIG. 1 provides a single point transmit/receive location in the center of the waveguide. This probe is suitable for the injection or extraction of $E_{(0,1)}$ mode waves.

Figure 2:
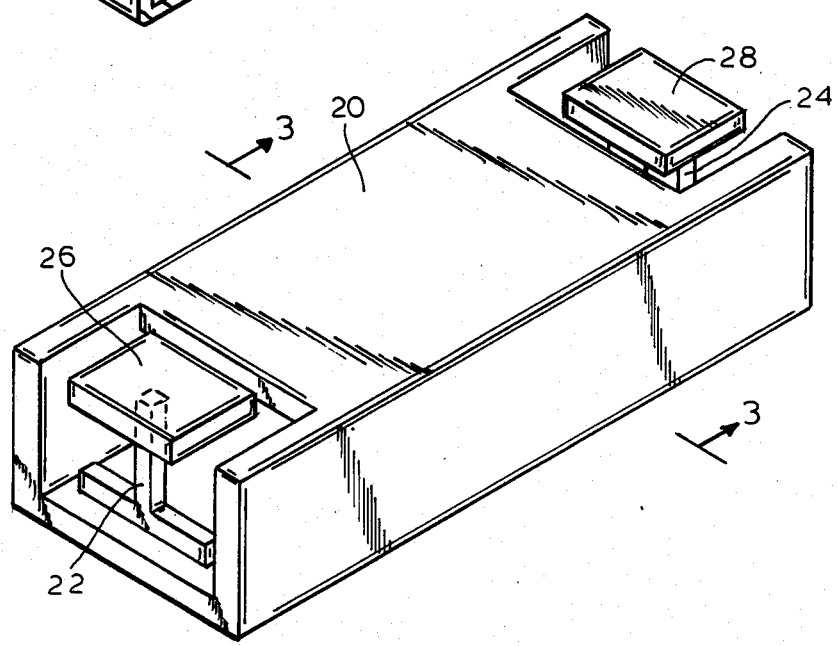
FIG. 2 is an isometric partial sectional view of another embodiment of the invention.

In the embodiment of FIG. 2, a wave guide 20 is shown with input and output probes 22, 24. These probes have a "T" transmitter/receiver shape suitable for injecting signals in the mode $E_{(1,1)}$. Probes 22 and 24 are also connected to pads 26, 28 similar to pad 16 of FIG. 1.

Figure 3:
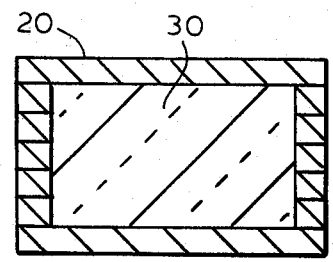
FIG. 3 is a cross-sectional view of the microwave guide.

As best shown in FIG. 3, the waveguide comprises a plurality of overlapping conductive strips selected and arranged to form the desired rectangular cross-section. Obviously similar strips may be used to generate a cross-section having any other geometrical shape. The interior of the guide is preferably filled with a dielectric material 30 such as polyimide.

The waveguide of FIG. 1 is imbedded in the substrate of a printed circuit board as shown in FIGS. 4a–h and described below.

Figure 4A:
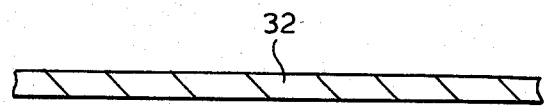
FIGS. 4a–4h shows a method of making the miniature microwave guide.

First, a layer of conductive material 32 is formed as shown in FIG. 4a. This layer forms the bottom wall of the wave guide.

Figure 4B:
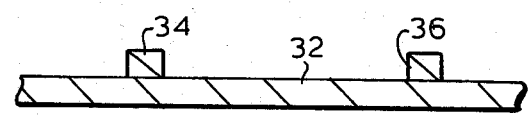
Figure 4C:
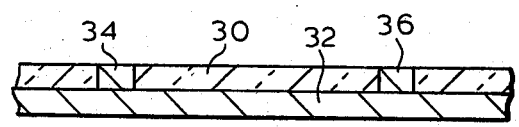
Figure 4D:
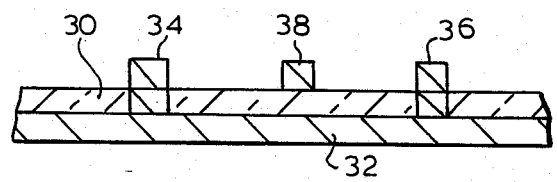

On top of layer 32 two relatively narrow conductive strips 34, 36 are applied as shown in FIG. 4b. Then a dielectric material 30 is built up between and around conductors 34 and 36 to a level which is even with the top conductive strip as shown in FIG. 4c. In FIG. 4d, another layer of the conductive side wall is applied (34, 36) coextensive to the sidewall applied in FIG. 4b. At the same time, the tip of the probe (38) is applied in the same layer by varying the optical photomasks used in successive layer deposition.

Figure 4E:
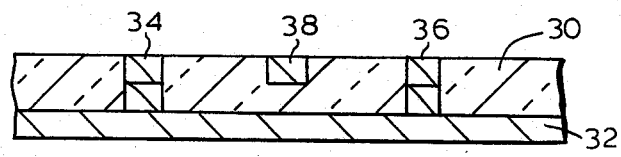

In FIG. 4e, the dielectric material is again built up between and around conductors 34, 36 and 38 to a level even with the newly defined top of conductor 38.

Figure 4F:
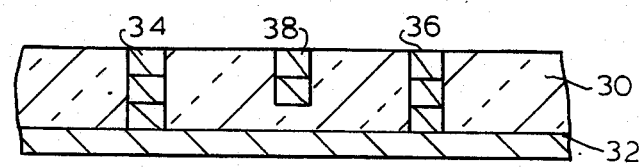
Figure 4G:
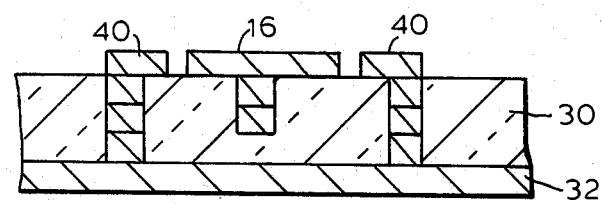

The process steps of 4d and 4e are repeated to apply additional conductive and dielectric layer as shown in FIG. 4f.

Figure 4H:
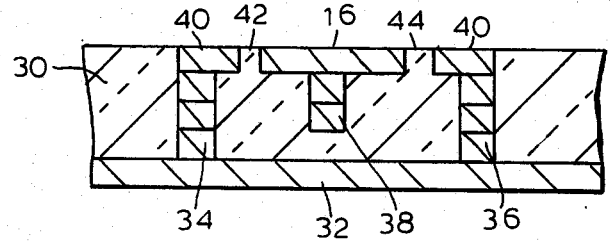

Next, a conductive layer (40, 16) is deposited on top of the sidewalls 34 and 36 and probe 38 (FIG. 4g) to form the top wall 10 of the wave guide and the bonding pad 16. Suitable spacing is left around the probe pad such as at 42, 44 to keep the pad 16 electrically insulated from the wave guide. A final dielectric layer is applied to complete the build up as shown in FIG. 4h.

Typically the inner dimensions of the waveguide are in the order of $10\times15$ mils for a 10 gigahertz microwave. The distance between probe 16 and end wall 12 is equal to the quarter wavelength of the signal to be transmitted through the waveguide.

The layers of FIGS. 4a–h are superimposed by using standard photomasking techniques. Conductive layers are formed by additive processes and selectively patterned by subtractive processes. Dielectric layers are filled and leveled to the top of each successive conductor level.

Advantageously other elements such as a miniature shielded conductors can be formed in the substrate at the same time with the waveguide by providing an appropriate mask for each layer.

Obviously numerous modifications may be made to the invention without departing from its scope as defined in the attached claims.

I claim:

1. A microwave guide, comprising:
   a first elongated conductive strip disposed as a first layer;
   a plurality of pairs of elongated conductive strips disposed as portions of a plurality of layers overlaying said first layer; and
   a second elongated conductive strip disposed as another layer overlaying the plurality of layers, said elongated conductive strips in adjacent layers being aligned to form an elongated microwave guide having a predetermined cross-section enclosed by said conductive strips.

2. A microwave guide as described in claim 1, wherein said first and second conductive strips form two parallel walls of the waveguide and said pairs of elongated conductive strips form two parallel walls of the waveguide perpendicular to the first and second conductive strips.

3. A microwave guide as described in claim 1, further comprising a dielectric material disposed within the predetermined cross-sectional area of the microwave guide.

4. A microwave guide as described in claim 1, additionally comprising:
   signal injecting means disposed within the cross-section of said microwave guide at a first location; and
   signal extracting means disposed within the cross-section of said microwave guide at a second location.

5. A microwave guide as described in claim 4, wherein the microwave guide is adapted to transmit a predetermined signal mode and said signal injecting and extracting means comprise members having a shape preselected in accordance the signal mode.

6. A microwave guide as described in claim 5, wherein said signal injecting and extracting means each comprise a T shaped member.

7. A microwave guide as described in claim 5, wherein said signal injecting and extracting means each comprise an I shaped member.

8. A microwave guide as described in claim 4, wherein the signal injecting and extracting means each additionally comprise a bonding pad extending through the conductive strips forming the waveguide.

9. A microwave guide as described in claim 1, additionally comprising, a plurality of conductive strips disposed in said plurality of layers and arranged to form end walls of said microwave guide.

10. A microwave guide as described in claim 1, additionally comprising, a plurality of conductive strips disposed in said plurality of layers and arranged to form signal injecting and extracting means disposed at different locations in the cross-section of the microwave guide.

11. A method of forming a microwave guide, comprising the steps of:
    providing a first elongated conductive strip disposed as a first layer;
    applying a plurality of successive pairs of elongated conductive strips disposed as portions of a plurality of successive layers overlaying said first layer; and
    providing a second elongated conductive strip disposed as another layer overlaying the plurality of layers, said conductive strips in adjacent layers aligned to form an elongated microwave guide having a predetermined cross-section enclosed by said conductive strips.

12. A method of making a microwave guide as described in claim 1, additionally comprising the step of providing dielectric material within the predetermined cross-section of the microwave guide.

13. A microwave guide embedded in a planar substrate, comprising:
    a first planar layer formed of a conductive material;
    a plurality of planar layers disposed on said first planar layer, each layer having conductive portions;
    a second planar layer formed of a conductive material disposed on the plurality of planar layers, said first and second planar layers and the conductive portions of the plurality of layers being aligned to form an elongated microwave guide having a predetermined cross-section enclosed by conductive material;
    a T shaped signal injecting member disposed within the cross-section of said microwave guide at a first location; and
    a T shaped signal extracting member disposed within the cross-section of said microwave guide at a second location, whereby said microwave guide is adapted to transmit a predetermined signal mode as determined by the T shaped signal injecting and extracting members.

14. A microwave guide as described in claim 13, wherein the signal injecting and extracting members each additionally comprise a pad extending through one of said planar layers.

15. A microwave guide embedded in a planar substrate, comprising:
    a first planar layer formed of a conductive material;
    a plurality of planar layers disposed on said first planar layer, each layer having conductive portions;
    a second planar layer formed of a conductive material disposed on the plurality of planar layers, said first and second planar layers and the conductive portions of the plurality of layers being aligned to form an elongated microwave guide having a predetermined cross-section enclosed by conductive material;
    an I shaped signal injecting member disposed within the cross-section of said microwave guide at a first location; and
    an I shaped signal extracting members disposed within the cross-section of said microwave guide at a second location, whereby said microwave guide is adapted to transmit a predetermined signal mode as determined by the I shaped signal injecting and extracting members.

16. A microwave guide as described in claim 15, wherein the signal injecting and extracting members each additionally comprise a pad extending through one of said planar layers.

17. A microwave guide, comprising;
    an elongated microwave guide structure having a predetermined cross-section enclosed by conductive material; and
    conductive portions of a plurality of layers formed and arranged within the cross-sectional area of the waveguide to form a T shaped signal injection member at a first location and a T shaped signal extracting member at a second location, whereby the microwave guide is adapted to transmit a predetermined signal mode in accordance with the T shaped signal injecting and extracting members.

18. A microwave guide as described in claim 17, wherein the signal injecting and extracting members each additionally comprise a bonding pad extending through the conductive material enclosing said waveguide.

19. A microwave guide, comprising;
an elongated microwave guide structure having a predetermined cross-section enclosed by conductive material; and
conductive portions of a plurality of layers formed and arranged within the cross-sectional area of the waveguide to form an I shaped signal injection member at a first location and an I shaped signal extracting member at a second location, whereby the microwave guide is adapted to transmit a predetermined signal mode in accordance with the I shaped signal injecting and extracting members.

20. A microwave guide as described in claim 19, wherein the signal injecting and extracting members each additionally comprise a bonding pad extending through the conductive material enclosing said waveguide.

* * * * *